(12) United States Patent
Azenkot et al.

(10) Patent No.: US 9,496,884 B1
(45) Date of Patent: Nov. 15, 2016

(54) DC OFFSET CALIBRATION OF ADC WITH ALTERNATE COMPARATORS

(71) Applicant: Applied Micro Circuits Corporation, Sunnyvale, CA (US)

(72) Inventors: Yehuda Azenkot, San Jose, CA (US); Nanda Govind Jayaraman, Santa Clara, CA (US)

(73) Assignee: Applied Micro Circuits Corporation, Sunnyvale, CA (US)

(*) Notice: Subject to any disclaimer, the term of this patent is extended or adjusted under 35 U.S.C. 154(b) by 0 days.

(21) Appl. No.: 15/076,338

(22) Filed: Mar. 21, 2016

(51) Int. Cl.
*H03M 1/06* (2006.01)
*H03M 1/10* (2006.01)
*H03M 1/12* (2006.01)
*H03M 1/00* (2006.01)

(52) U.S. Cl.
CPC ............. *H03M 1/1023* (2013.01); *H03M 1/00* (2013.01); *H03M 1/12* (2013.01)

(58) Field of Classification Search
CPC ................................. H03M 1/12; H03M 1/00
USPC ................. 341/120, 118, 155, 162, 163, 164
See application file for complete search history.

(56) References Cited

U.S. PATENT DOCUMENTS

2008/0158037 A1* 7/2008 Hsien ................. H03M 1/1061
341/164

* cited by examiner

*Primary Examiner* — Joseph Lauture (57) ABSTRACT

System and method of calibrating the DC offsets of alternate comparators in an ADC in the background based on the digital outputs of the ADC. In parallel with A/D conversion of a plurality of samples, the calibration logic uses two counters to count the occurrences of the ADC outputs that represent samples falling in a first analog range and a second analog range, respectively. The two ranges are symmetric about the MSB reference voltage and in combination cover the nominal voltage range of the bit. The DC offset is derived based on a ratio of the difference between the two counts and a sum of the two counts. The calibration logic may alternately calibrate the comparators. Each comparator may be calibrated successively based on various bits associated therewith.

20 Claims, 7 Drawing Sheets

DC OFFSET CALIBRATION OF ADC WITH ALTERNATE COMPARATORS

TECHNICAL FIELD

The present disclosure relates generally to the field of Analog-to-Digital Converters (ADCs) and, more specifically, to the field of DC offset calibration for ADCs.

BACKGROUND OF THE INVENTION

In communication networks, high-speed digital receivers use Analog-to-Digital Converters (ADCs) to process received signal digitally. Converting a received signal into a digital form via an ADC allows a receiver to employ complex equalization logic. Usually, longer equalization is needed for higher signaling constellations and tougher channels. Thus, fast yet energy efficient, ADCs are needed in high-speed digital receivers. A typical high-speed ADC resolution is between 5 to 8 bits.

ADCs with more than 6-bit precision running at several GHz are almost impossible to build as a single-channel ADC. Therefore, typically, a number of slower ADCs are interleaved to overcome the speed limitation of a single-channel ADC. A suitable sub-ADC should provide a high speed-per-area ratio to reduce the total area of a time-interleaved ADC and an optimized speed-per-power ratio to keep the overall power consumption low. Successive-approximation-register (SAR) ADCs exhibit superior energy efficiency for medium-resolution applications.

High-speed operation can be achieved by converting each sample with two alternate comparators clocked asynchronously. The use of alternate comparators can improve the ADC speed by about 20% without consuming additional power. An ADC offset is a random additive error typically stemming from the comparator direct current (DC) offset. In a single-channel ADC, a DC offset creates a DC tone that can be easily corrected and is often ignored in many communication applications. The impact of the DC offset is much more detrimental in time-interleaved ADCs. In practical implementations, the interleaved channels can have different DC offsets, which need to be corrected through DC offset calibration processes.

Figure 1:
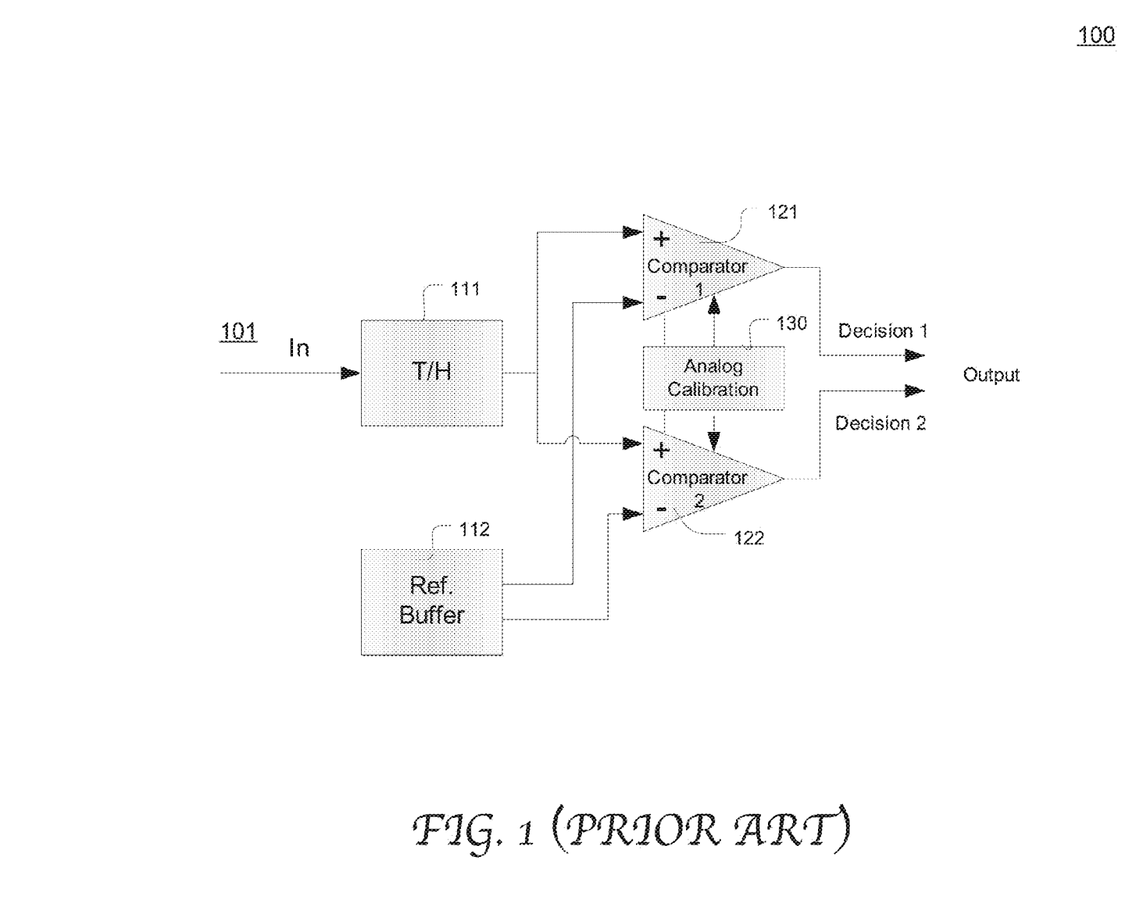
FIG. 1 illustrates the configuration of a time-interleaved ADC with the calibration logic for calibrating DC offsets in accordance with the prior art.

FIG. 1 illustrates the configuration of a time-interleaved ADC 100 with the calibration logic 130 for calibrating DC offsets in accordance with the prior art. The ADC 100 includes two comparators 121 and 122 coupled to the track-and-hold circuit (T/H) 111 and a reference buffer 112 storing reference voltages for all the bits. The comparators 121 and 122 operate in an alternating fashion to generate respective bits of a digital output.

During operation, the input signal 101 is fed to the T/H 111, which outputs sampled signals. Each comparator compares a sampled signal with a reference voltage of a particular bit and outputs the decision signal as the digital value of a corresponding bit. More specifically, a decision 1 is output by the comparator 1 121 while the comparator 2 122 is in a reset mode. When the comparator 1 121 finishes its decision, it goes into the reset mode with minimal delay, while the comparator 2 122 is activated to make the decision 2. This provides the comparator 1 much more time for reset and thus eliminates the reset time from the critical path.

The analog calibration logic 130 utilizes a conventional analog calibration scheme to calibrate the DC offsets of the comparators 121 and 122, which demands undesirable complex analog circuit design and high power consumption. Also, the conventional calibration techniques are performed in the foreground (or "offline"), which require an interruption of the operation of the ADC. Specifically, during the time windows dedicated for calibration, the comparators stop receiving sampled signals for conversion and instead receive calibration signals generated from the calibration logic. The extra calibration time inevitably delays signal processing at the ADC and the high speed digital receiver.

SUMMARY OF THE INVENTION

Therefore, it would also be advantageous to provide a DC offset calibration mechanism for high speed analog-to-digital converters (ADCs) that offers enhanced time efficiency and power efficiency without introducing complex circuit design.

Embodiments of the present disclosure utilize calibration logic capable of calibrating the DC offsets of alternate comparators in the background based on the digital output of the ADC. In parallel with analog-to-digital conversion of a plurality of samples, the calibration logic uses two counters to count the occurrences of the ADC outputs that represent samples falling in a first analog range and a second analog range, respectively. The first analog range and the second analog range are defined such that they are symmetric about the MSB reference voltage and, in combination, cover the full range of the voltage represented by the bit. The DC offset is derived based on a ratio of the difference between the two counts and a sum of the two counts. The DC offset is then incorporated into the input signal, the ADC output, or the reference voltage for correction. The calibration logic may alternately calibrate the comparators. Each comparator may be calibrated successively based on various bits associated therewith.

According to embodiments of the present disclosure, DC offset calibration is performed concurrently with the analog-to-digital (A/D) conversion, where the digital outputs are used to determine the DC offsets in the background. In turn, the derived DC offsets can be instantaneously fed back to the A/D conversion process for compensation. Thus, compared with the conventional techniques which need to insert extra time windows for calibration in A/D conversion, the calibration mechanism according to the present disclosure significantly and advantageously improves the overall speed of an ADC. Moreover, as the calibration exploits the digital outputs of the ADC to derive the DC offsets, the calibration logic can be advantageously implemented in the digital domain and, thus, is much simpler than a conventional analog design.

In accordance with an embodiment of the present disclosure, a method of calibrating an ADC includes converting an analog input signal to a first plurality of digital numbers, where a respective digital number comprises M bits and M is an integer greater than 0. A first count of digital numbers that represent samples of said analog input signal in a first analog range is determined. A second count of digital numbers that represent samples of said analog input signal in a second analog range is also determined. A first direct current (DC) offset of the ADC is then determined based on said first count and said second count.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

DETAILED DESCRIPTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. Although a method may be depicted as a sequence of numbered steps for clarity, the numbering does not necessarily dictate the order of the steps. It should be understood that some of the steps may be skipped, performed in parallel, or performed without the requirement of maintaining a strict order of sequence. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

BRIEF DESCRIPTION OF THE DRAWINGS

Embodiments of the present invention will be better understood from a reading of the following detailed description, taken in conjunction with the accompanying drawing figures in which like reference characters designate like elements and in which.

DC OFFSET CALIBRATION OF ADC WITH ALTERNATE COMPARATORS

Overall, embodiments of the present disclosure provide a calibration mechanism to calibrate DC offsets in analog-to-digital converters (ADCs) based on the ADC digital outputs responsive to a set of sampled signals provided to the comparators. During A/D conversion, a set of sampled signals are compared with the reference voltage for the particular bit at a corresponding comparator. In parallel with the A/D conversion process and based on the digital numbers output from the ADC, the counts of samples that fall in a first analog range and a second analog range are respectively determined. The first and second analog ranges are symmetric with respect to the MSB reference voltage and, in combination, cover the full range of the voltage represented by the particular bit. Each comparator may be calibrated successively based on various bits associated therewith. The multiple comparators can be calibrated alternately.

Although embodiments of the present disclosure are described with reference to ADCs using voltage input, the present disclosure can be applied to any other suitable types of ADCs, such as current input ADCs.

Statistically speaking, in a communication network receiver, if an ADC comparator has no offset, the number of sampled signals that have a higher voltage than the reference voltage is equal to the number of samples that have a lower voltage than it. Conversely, if the ADC comparator has a DC offset, the numbers of samples that fall in the two voltage ranges become uneven and the difference is proportional to the DC offset. Thus, in practice, when a large number of samples are compared with the reference voltage at the comparator, the distribution of the signals in the two voltage ranges can be used to derive the DC offset of the comparator.

Figure 2:
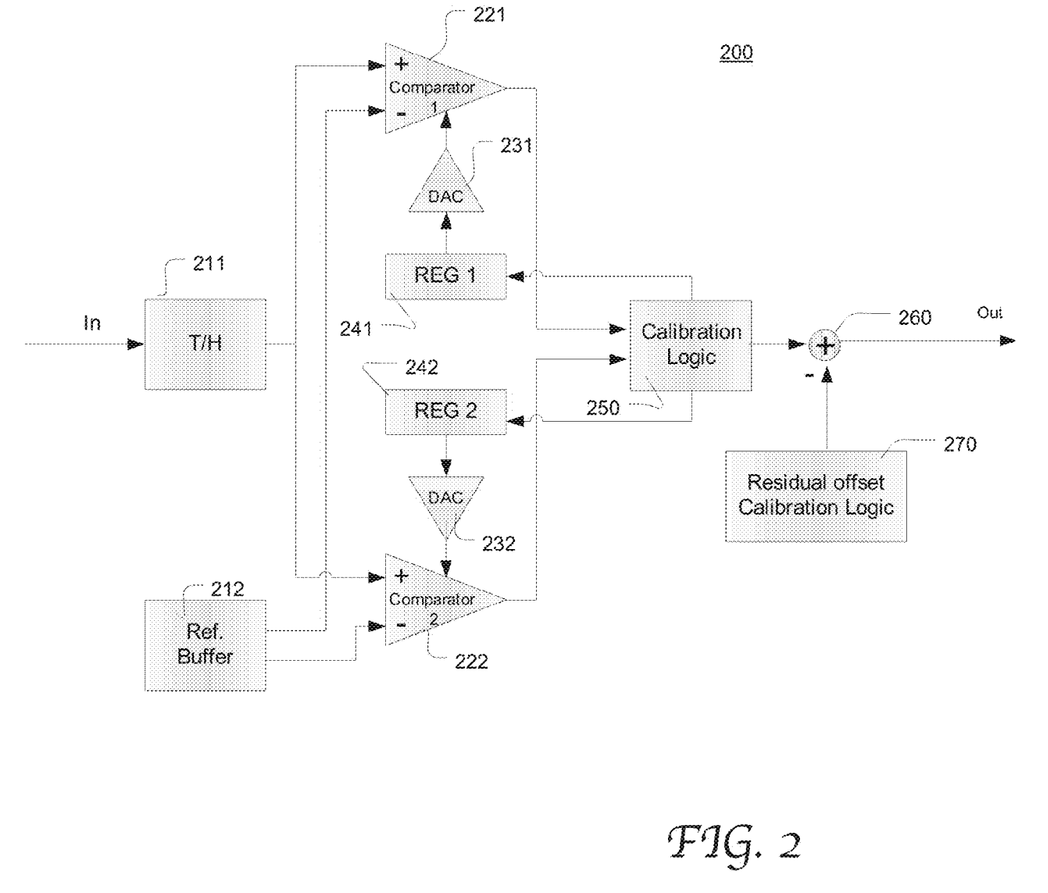
FIG. 2 illustrates the configuration of an exemplary ADC equipped with the calibration logic for calibrating DC offsets based on A/D conversion results in accordance with an embodiment of the present disclosure.

FIG. 2 illustrates the configuration of an exemplary ADC 200 equipped with the calibration logic 250 for calibrating DC offsets based on A/D conversion results in accordance with an embodiment of the present disclosure. The ADC 200 includes a T/H circuit 211 that samples the voltage of the analog input signal 201 and holds its value at a constant level for a specified minimum period of time. The reference buffer 212 stores the reference voltages of all the bits. The comparators 221 and 222 compare the sampled signals output from the T/H 211 and the reference voltages in an alternate manner to generate the binary values of respective bits. The DC offsets of the two comparators 221 and 222 can be calibrated via registers 241 and 242 and the digital-to-analog converters (DACs) 231 and 232. The register values are set by the calibration logic 250.

In the embodiments described herein, it assumed that the ADC output is in a straight binary form or offset binary, where the ADC output uses all the available numbers, running from 0 to $2^M-1$, where M is the total number of bits at the ADC output. For example, M can be 8 bits. The most negative signal is converted to all zeros and the most positive signal is all ones. However, the present disclosure is not limited by such implementation.

During A/D conversion, the alternate comparators convert sampled signals to digital numbers. For example, the comparator 1 221 outputs bits 1 (the MSB), 3, and 5, and the comparator 222 outputs bits 2, 4, and 6 (the least significant bit or LSB). According to the present disclosure, the calibration logic can derive a DC offset of a comparator based on a respective bit according to the binary output of the comparators. More specifically, for calibrating a particular comparator, a bit number is selected and, accordingly, the calibration logic defines a first and a second analog range that are symmetric with respect to the reference voltage of the most significant bit (MSB). The two ranges in combination cover the full analog range represented by the particular bit. The calibration logic uses the binary output resulted from A/D conversion to determine the counts of samples that fall in the two ranges respectively. Based on the difference between the two counts relative to the sum thereof as well as the nominal reference voltage of the particular bit, a DC offset is derived (or estimated) and stored on the corresponding register 241 or 242. The estimated DC offset can then be compensated by adding to or subtracting the value from the comparator input or output or the reference voltage. It will be appreciated that the present disclosure is not limited by the mechanism to compensate a DC offset in an ADC.

According to embodiments of the present disclosure, DC offset calibration is performed concurrently with the analog-to-digital (A/D) conversion, where the digital outputs are used to determine the DC offsets in the background. In turn, the derived DC offsets can be instantaneously fed back to the A/D conversion process for compensation. Thus, compared with the conventional techniques, which need to insert extra time windows for calibration in A/D conversion, the calibration mechanism according to the present disclosure significantly and advantageously improves the overall speed of an ADC. Moreover, as the calibration exploits the digital outputs of the ADC to derive the DC offsets, the calibration logic can be advantageously implemented in the digital domain, which involves much simpler and more power-efficient circuit design than a conventional analog design.

In addition, the residual DC offset of the digital ADC outputs can be compensated by the residual offset calibration logic 270 after an initial ADC calibration as described above. The residual DC offset is estimated using the ADC outputs.

More specifically, the DC offset estimate can be represented by:

$$d = \frac{1}{L} \cdot \sum_{i=1}^{L} x_i \qquad \text{Equation (1)}$$

where:
$x_i$ is the ADC outputs,
d is the DC offset estimate, and
L is the number of ADC outputs.

The DC offset estimate, d, is subtracted from the next received ADC output samples, represented as $$y_i = x_i - d$$

where $y_i$ represents the compensated ADC outputs.

Figure 3:
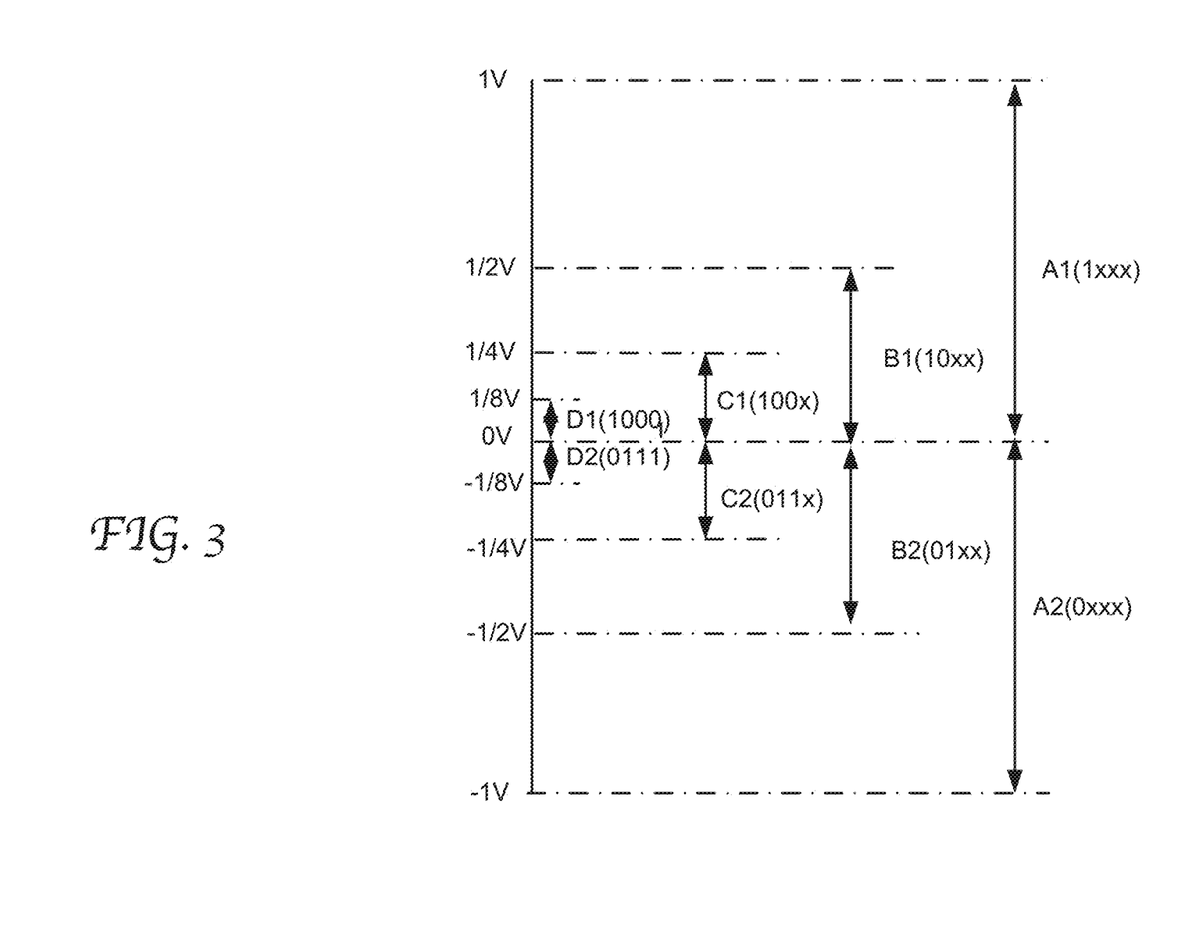
FIG. 3 illustrates the exemplary voltage ranges associated with respective bits which are used to determine the DC offsets of the multiple comparators of an ADC in accordance with an embodiment of the present disclosure.

FIG. 3 illustrates the exemplary voltage ranges used to determine the DC offsets based on various bits of an ADC in accordance with an embodiment of the present disclosure. It will be appreciated that the present disclosure is not limited by the number of bits, the analog ranges, or by the number of comparators of the ADC. In this example, the input signal voltage range spans −1V to 1V. Assume that the ADC in this example has 4 bits.

For calibrating a comparator based on the MSB (k=1), a set of sampled signals are fed to the ADC and compared with the MSB reference voltage. In response, digital numbers of M bits are output from the ADC. In this example, the reference voltage is set to the nominal value, 0V. The digital numbers are provided to the calibration logic to determine the counts of digital numbers with MSB equal to 1 and those with MSB equal to 0. The counts are represented as A1 and A2 respectively. As shown, A1 corresponds to the number of sampled signals that fall in the range of [0V, 1V], and A2 corresponds to the number of sampled signals that fall in the range of [−1V, 0V]. The difference between A1 and A2 (A1−A2) relative to the total number of the set of samples (A1+A2) is proportional to the DC offset for the MSB.

Likewise, to calibrate a comparator based on the second MSB (k=2), the ADC outputs generated in response to another set of sampled signals are used. In this example, the reference voltages for the second MSB are set to the nominal values −½V and ½V. The count of ADC outputs with the second MSB equal to 1 and MSB equal to 0 (01xx) is determined and represented as B2, and the count of those with the second MSB equal to 0 and the MSB equal to 1 (10xx) is determined and represented as B1 respectively.

Thus, as shown, B1 corresponds to the number of sampled signals that fall in the range of [0V, ½V], and B2 corresponds to the number of sampled signals that fall in the range of [−½V, 0V]. The two ranges are symmetric with respect to the reference voltage of the MSB. Any ADC outputs that fall outside the two ranges are ignored for calibration purposes. The difference between B1 and B2 (B1−B2) relative to the total number of the set of samples (B1+B2) is proportional to the DC offset for the comparator based on the second MSB.

Similarly, to determine the DC offset of bit 3, the numbers of samples that fall in the ranges of [0V, ¼V] and [−¼V, 0V] are counted and represented as C1 and C2 respectively. The counts are determined based on the corresponding digital numbers output from the ADC. The two ranges are symmetric with respect to the reference voltage of the MSB. The digital outputs corresponding to the sampled signals in the two ranges are 100x and 011x respectively. Any samples that fall outside the two ranges are ignored for calibration purposes. The difference between C1 and C2 (C1−C2) relative to the total number of the set of samples (C1+C2) is proportional to the DC offset for the comparator. By the same token, the DC offset of the LSB is determined based on D1 and D2 as shown.

Thus, in general, with respect to the bit number k, the counters count the ADC digital outputs with b1, b2, bk=1, 0, . . . , 0, and the ADC digital outputs with b1, b2, . . . , bk=0, 1, . . . , 1.

In some embodiments, the DC offset estimate, d(k), is given by:

$$d(k) = \begin{cases} -2 \cdot \dfrac{n_1 - n_2}{n_1 + n_2} \cdot v, & \text{for } k = 1 \\ 2 \cdot \dfrac{n_1 - n_2}{n_1 + n_2} \cdot v, & \text{otherwise} \end{cases} \qquad \text{(Equation 2)}$$

where:
k: the ADC bit number based on which the DC offset is estimated. In the example in FIG. 2, for the DC offset for comparator 1, use k=1, 3, 5, . . . ; for the DC offset for comparator 2, use k=2, 4, 6, . . . .

n1: the number of ADC samples out of total N samples with bits in the first range. For example, for the MSB, n1 corresponds to the number of outputs b1, b2, . . . , bk=1, 0, . . . , 0, where b1 is the MSB and the total number of bits is k n2: the number of ADC samples out of total N samples with bits b1, b2, . . . , bk=0, 1, . . . , 1, where b1 is the MSB and the total number of bits is k v: the nominal voltage of the selected ADC reference point, where ADC input is a signed signal. For an ADC input range of [−1,1], the reference voltage is $v=2^{-(k-1)}$, e.g., v=1, ½, ¼, . . . .

The maximum possible DC offset is limited depending on k. Particularly, max dc offset=$2^{-(k-1)}$ volt.

Figure 4:
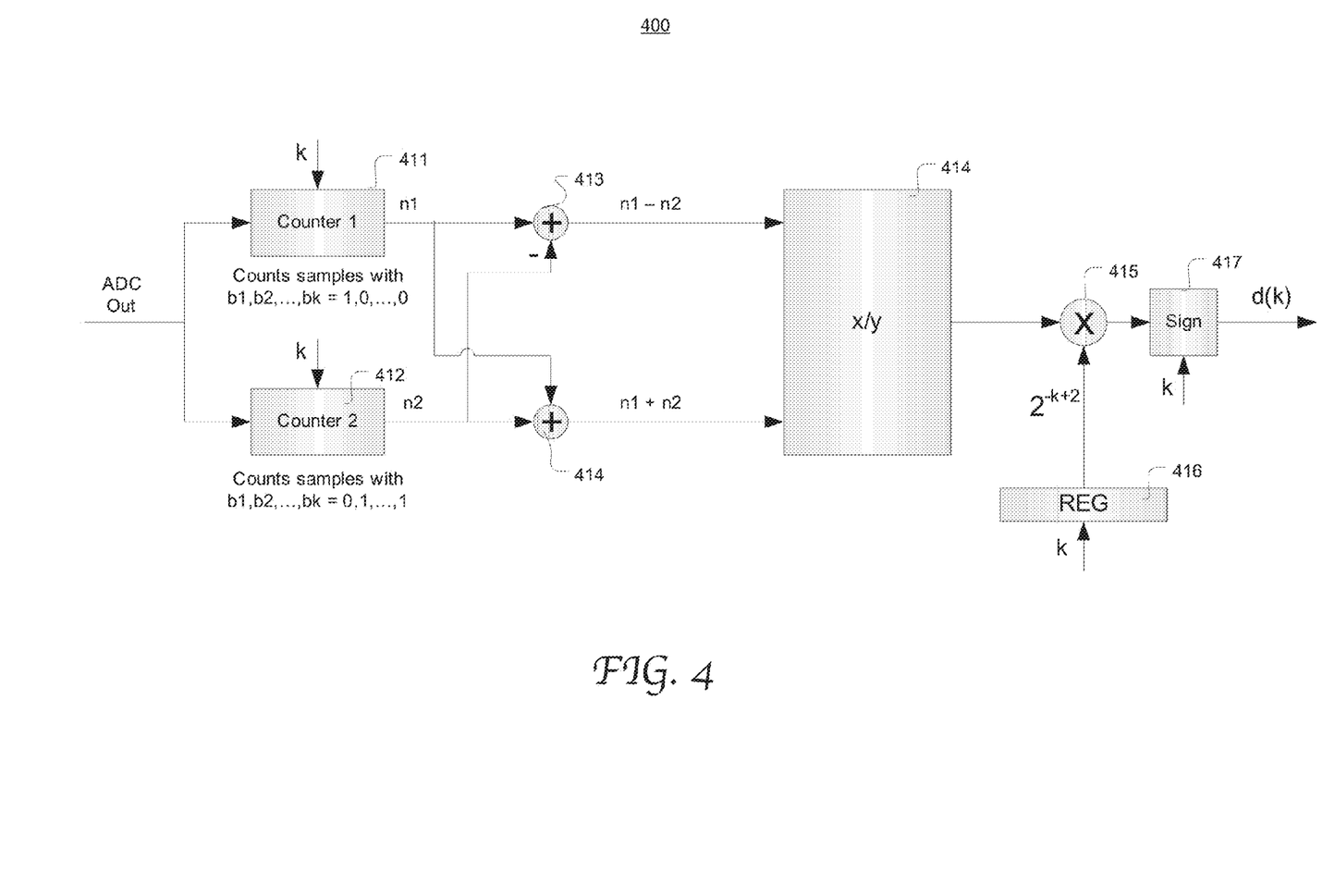
FIG. 4 illustrates the configuration of an exemplary calibration logic capable of determining the DC offsets of an ADC based on A/D conversion results in accordance with an embodiment of the present disclosure.

FIG. 4 illustrates the configuration of an exemplary calibration logic 400 capable of determining the DC offsets of an ADC based on A/D conversion results responsive to sampled signals in accordance with an embodiment of the present disclosure. The calibration logic 400 includes counters 411 and 412 coupled to the output of the comparators, an adder 414, a subtractor 413, a divider 414, and a multiplier 415 coupled to a register 416.

For a given k, the calibration logic defines the two selected groups of ADC output. The first group is generated responsive to the samples falling in the first voltage range and the second group is generated responsive to the samples falling in the second voltage range, as described in greater detail with reference to FIG. 3.

Each time the ADC outputs a number falling in the first group, the counter 411 increments, and each time the ADC outputs a number falling in the second group, the counter 412 increments. To simplify the division in the implementation, the number of samples that contribute to determine a DC offset set is set such that n1+n2=$2^m$, where m is an integer. In this way, the division becomes a simple shift. For instance, the total number of samples can be in the scale of millions of tens of millions, e.g., 20 millions.

The adder 413 and subtractor 414 generate the sum and the difference between n1 and n2, which are fed to the divider 414 to obtain a ratio thereof. The multiplier generates a product of the ratio and the nominal voltage range represented by the particular bit ($v=2^{-(k-1)}$). The DC offset of the bit k (represented as d(k)) with the proper sign added by 417 is then output from the calibration logic 400. The DC offset of the bit k can be stored in the registers (e.g., 241 or 242 in FIG. 2) and fed to the corresponding comparator for correction.

Figure 5:
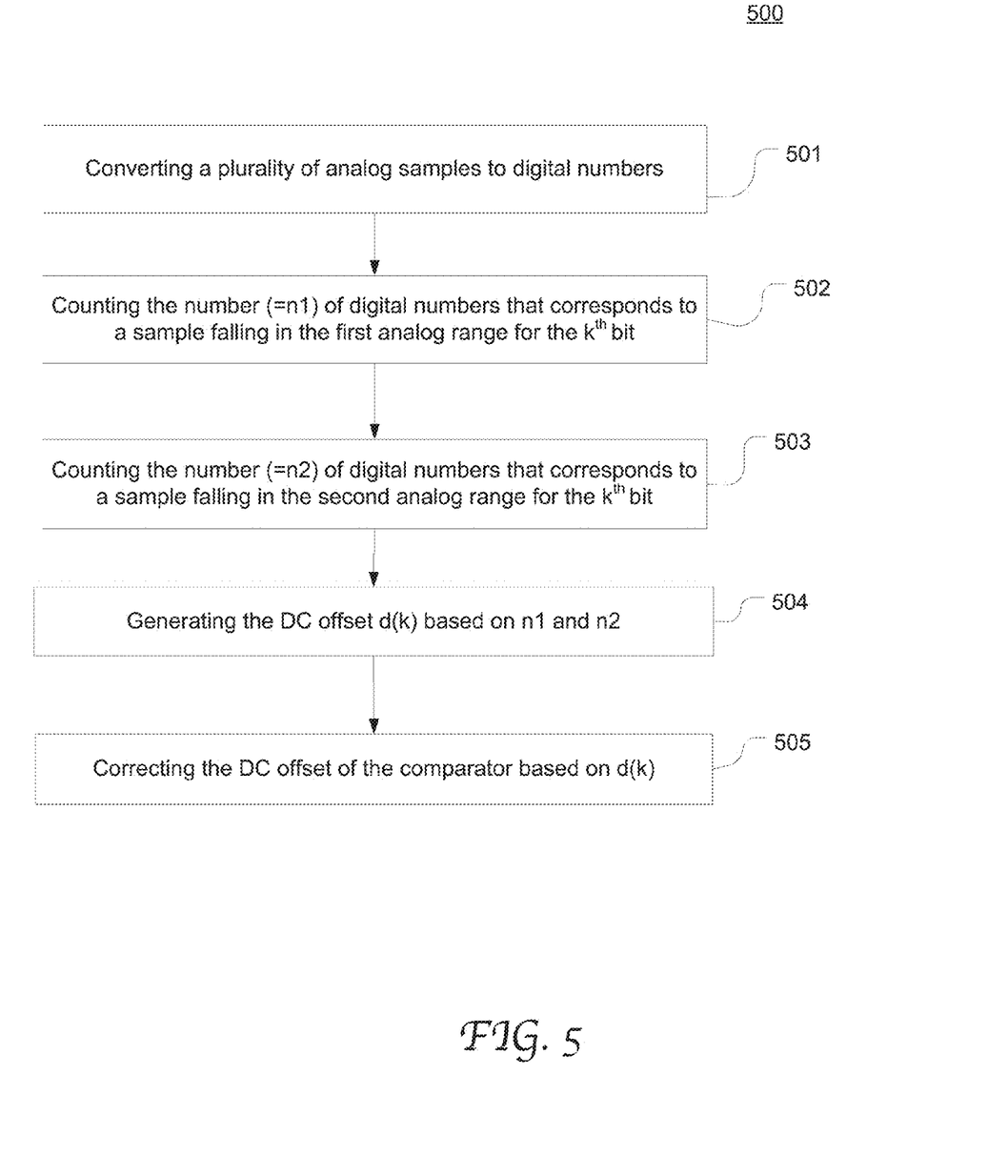
FIG. 5 is a flowchart depicting an exemplary process of calibrating a comparator in an ADC based on a particular bit number k in accordance with an embodiment of the present disclosure.

FIG. 5 is a flowchart depicting an exemplary process 500 of calibrating a comparator in an ADC based on a particular bit k in accordance with an embodiment of the present disclosure. The comparator generates the values of the $k^{th}$ bit. For example, process 500 can be performed by the calibration logic shown in FIG. 4. At 501, a plurality of analog signal samples are converted to digital numbers of M bits by the comparators. In parallel with 501, the digital numbers that represent samples falling in the first analog range are counted at 502, and those that represent samples falling in the second analog range are counted at 503. The two analog ranges are dictated by the bit number k. Using the $2^{nd}$ MSB shown in FIG. 3 as an example, the digital numbers of 10xx represent the samples in the range [0V, ½V], and the digital numbers of 01xx represent the samples in the range of [−½V, 0V].

At 504, the DC offset is generated based on the two counts, e.g., according to Equation 2. The DC offset of the comparator is then corrected accordingly at 505. The foregoing process 501-505 can be repeated with respect to each k.

Generally, at the beginning of calibration, when the DC offset is likely high, a small value of k is preferably be used. For example, for DC offset of the comparator 1, k=1 is used and so the calibration is performed based on the MSB. For the DC offset of the comparator 2, the calibration is based on the second MSB, or k=2. In some embodiments, for a particular k, the calibration process can be repeated until the DC offset is smaller than a predefined threshold.

Figure 6:
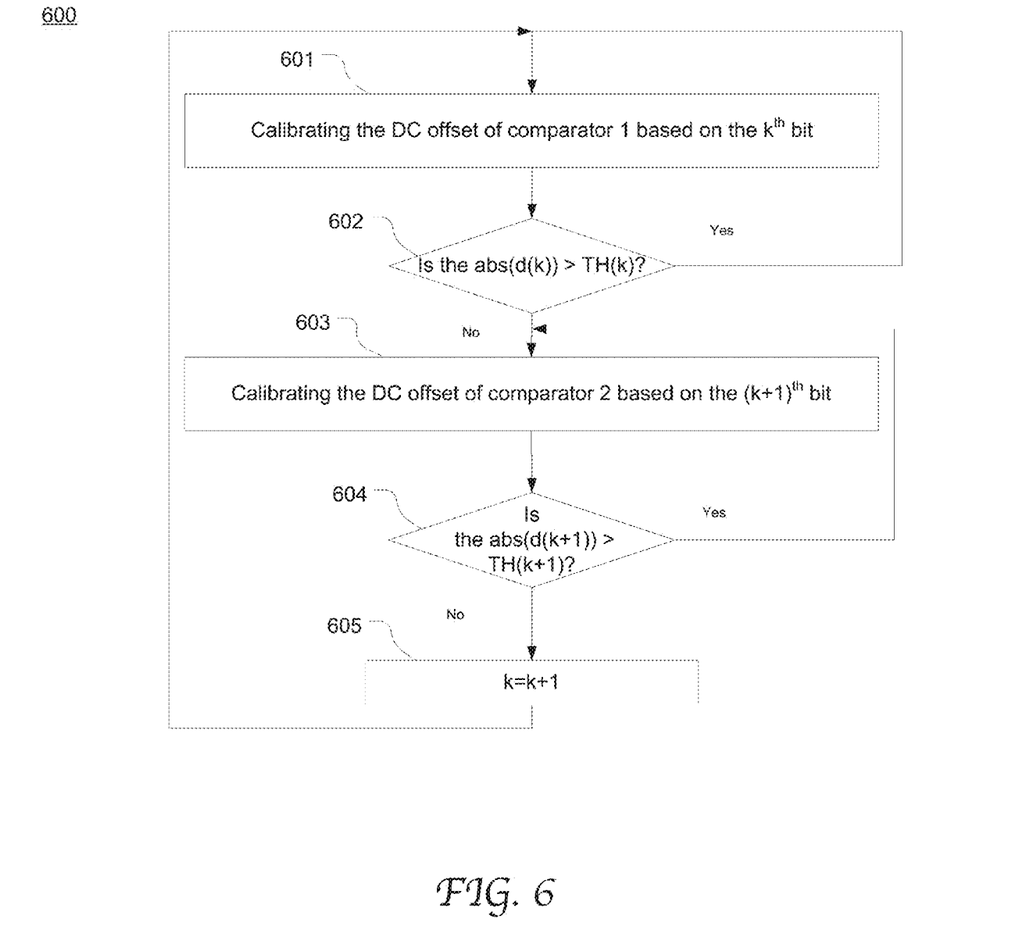
FIG. 6 is a flowchart depicting an exemplary process of calibrating the multiple comparators in an ADC in accordance with an embodiment of the present disclosure.

FIG. 6 is a flowchart depicting an exemplary process 600 of calibrating the alternate comparators in an ADC in accordance with an embodiment of the present disclosure. The present disclosure is not limited by the number of comparators in an ADC. In this example, the ADC has two alternate comparators. At 601, the comparator 1 is calibrated based on the $k^{th}$ bit as described with greater detail with reference to FIG. 5. For example, at the beginning, the bit number is set to k=1 (the MSB), the sampled number is set to N(k), and a threshold TH(1) is set for the DC offset estimate based on the MSB (k=1). Once d(1) is generated, it is added to the register (e.g., REG 241 in FIG. 2) associated with the comparator 1 and used for correction. At 602, abs(d(k)) is compared with TH(k). If abs(d(k)) is greater than TH(k), process 601 is repeated by using another N(k) samples to calibrate the comparator 1.

Otherwise, the comparator 2 is calibrated at 603 based on the $(k+1)^{th}$ bit as described in greater detail with reference to FIG. 5. For example, after d(1) is corrected at 601, k is set to 2, the sampled number is set to N(2), and a threshold TH(2) is set for the DC offset estimate based on the $2^{nd}$ MSB (k=2). At 604, abs(d(+1)) is compared with TH(k+1). If abs(d(k+1)) is greater than TH(k+1), process 603 is repeated by using another N(k+1) samples to calibrate the comparator 2. Otherwise, k is incremented at 605 and the process 601-604 is repeated for calibrating the two comparators to another level of precision.

As a result, the comparator 1 is calibrated based on k=1, 3, 5, . . . successively, and the comparator 2 is calibrated based on k=2, 4, 6, . . . successively. Any residual DC offset can be corrected by residual calibration logic as described with reference to Equation 1.

Figure 7:
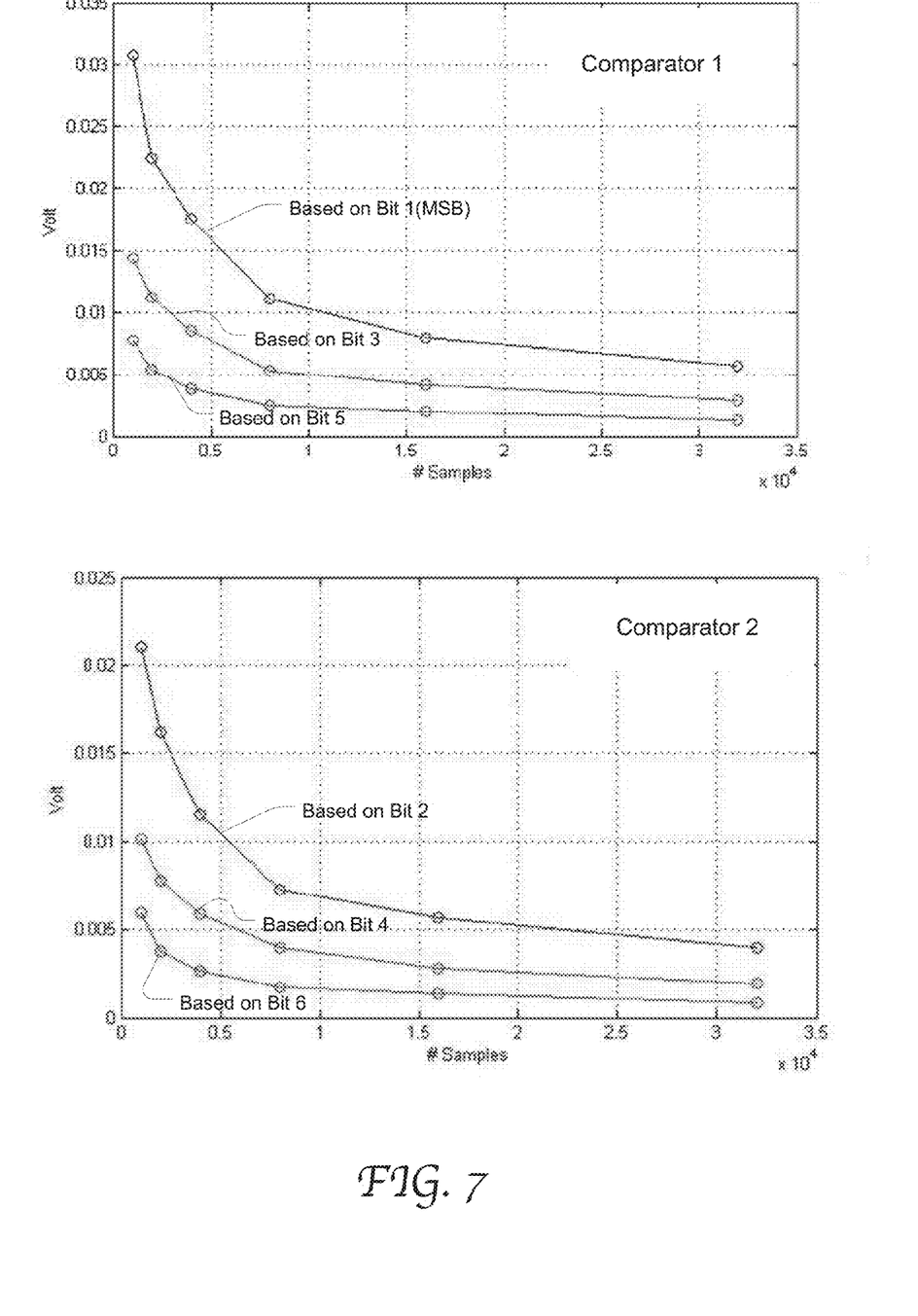
FIG. 7 shows simulated results demonstrating the standard deviation of the DC offsets of two alternate comparators estimated by exemplary calibration logic according to an embodiment of the present disclosure.

FIG. 7 shows simulated results demonstrating the standard deviations of the DC offsets of two alternate comparators estimated by exemplary calibration logic according to an embodiment of the present disclosure. The data plots show the standard deviation as a function of ADC outputs. The standard deviation is found via a simulation for the case of an input signal range from −1 to 1 V, with uniform distribution. As shown, the standard deviation of the DC offset becomes smaller as the number of samples, N, is larger and if it is based on a higher bit, k.

What is claimed is:

1. A method of calibrating an analog-to-digital converter (ADC), said method comprising:
    converting an analog input signal to a first plurality of digital numbers, wherein a respective digital number comprises M bits and M is an integer greater than 0;
    determining a first count of digital numbers of said first plurality of digital numbers that represent samples of said analog input signal in a first analog range;
    determining a second count of digital numbers of said first plurality of digital numbers that represent samples of said analog input signal in a second analog range; and
    determining a first direct current (DC) offset of said ADC based on said first count and said second count.

2. The method of claim 1, wherein said ADC comprises N comparators and N is equal to or smaller than M; said converting comprises interleaving output from said N comparators to generate said respective digital number; and said converting comprises comparing samples of said analog input signal with M references of said M bits.

3. The method of claim 2, wherein said first analog range and said second analog range are symmetric with respect to a first reference configured for a most significant bit (MSB) of said M bits.

4. The method of claim 1, wherein a combination of said first analog range and said second analog range corresponds to a full analog range associated with a bit of said M bits, wherein values of said bit are output from a first comparator of said N comparators.

5. The method of claim 4 further comprising, responsive to a determination that said first DC offset is less than a threshold value, determining a second DC offset associated a second comparator of said N comparators based on another bit of said M bits and based on a second plurality of digital numbers output from said ADC.

6. The method of claim 4 further comprising subtracting said first DC offset from a reference voltage provided to said first comparator for compensation.

7. The method of claim 1, wherein said determining said first direct current (DC) offset comprising determining a ratio of a difference between said first count and said second count to a sum of said first count and said second count.

8. The method of claim 1 further comprising:
averaging a plurality of digital numbers converted from said analog input signal to determine a residual offset of said ADC; and
subtracting said residual offset from digital numbers output from said ADC.

9. An analog-to-digital converter (ADC) comprising:
a plurality of ADC channels configured to convert an input analog signal into a first plurality of digital numbers of M bits; and
calibration logic comprising:
a first counter configured to obtain a first count of digital numbers of said first plurality of digital numbers that represent samples of said analog input signal in a first analog range;
a second counter configured to obtain a second count of digital numbers of said first plurality of digital numbers that represent samples of said analog input signal in a second analog range, wherein said first analog range and said second analog range are associated with a $k^{th}$ bit of said M bit; and
first logic configured to generate a DC offset of a first channel based on said first count and said second count, wherein said first channel is configured to generate values of said $k^{th}$ bit.

10. The ADC of claim 9, wherein said plurality of ADC channels comprises N alternate comparators and N is equal to or smaller than M, and wherein said $k^{th}$ bit is output from a first channel configured to compare samples of said input analog signal with a reference voltage associated with said $k^{th}$ bit.

11. The ADC of claim 10, wherein said calibration logic is configured to sending said DC offset to an input of a comparator in said first channel that outputs values of said $k^{th}$ bit.

12. The ADC of claim 9, wherein said first analog range and said second analog range are symmetric with reference to a first reference voltage associate with a most significant bit (MSB) of said M bits.

13. The ADC of claim 9, wherein said first logic comprises:
two adders coupled to said first counter and said second counter and configured to generate a difference between and a sum of said first count and said second count;
a divider coupled to output of said first counter and said second counter and configured to generate a ratio between said difference and said sum; and
a multiplier configured multiple said ratio with a voltage representing an analog range associated with said $k^{th}$ bit.

14. The ADC of claim 9, wherein said calibration logic further comprises second logic configured to:
average a third plurality of digital numbers of said analog input signal to determine a residual offset; and
subtract said residual offset from an output of said ADC.

15. The ADC of claim 9, wherein said calibration logic is configured to alternately calibrate said plurality of ADC channels.

16. An analog-to-digital converter (ADC) comprising:
a plurality of alternate comparators configured to convert an input analog signal into a first plurality of digital numbers; and
calibration logic coupled to said alternate comparators and configured to calibrate a respective comparator by:
determining a first count of digital numbers of said first plurality of digital numbers that represent samples of said analog input signal in a first analog range;
determining a second count of digital numbers of said first plurality of digital numbers that represent samples of said analog input signal in a second analog range; and
determining a first direct current (DC) offset of said respective comparator based on said first count and said second count.

17. The ADC of claim 16, wherein: each of said first plurality of digital numbers comprises M bits; a combination of said first analog range and said second analog range corresponds to an analog range represented by a $k^{th}$ bit of said M bits; said calibration logic is further configured to adjust an input of said respective comparator based on said first direct DC offset; and said respective comparator is configured to output said $k^{th}$ bit.

18. The ADC of claim 17, wherein said first analog range and said second analog range are symmetric with reference to a first reference configured for a most significant bit (MSB) of said M bits.

19. The ADC of claim 17, wherein said first direct current (DC) offset is determined by:
generating a ratio of a difference of said first count and said second count to a sum of said first count and said second count; and
multiplying said ratio with said analog range associated with said $k^{th}$ bit.

20. The ADC of claim 16 further, wherein said calibration logic is further configured to:
average a second plurality of digital numbers of said analog input signal to determine a residual offset; and
subtract said residual offset from an output of said ADC.

* * * * *